US 11,356,778 B2

(12) United States Patent
Noro

(10) Patent No.: US 11,356,778 B2
(45) Date of Patent: Jun. 7, 2022

(54) SPEAKER CONTROLLER, SIGNAL SUPPLYING DEVICE, AND SPEAKER SYSTEM

(71) Applicant: Yamaha Corporation, Hamamatsu (JP)

(72) Inventor: Masao Noro, Hamamatsu (JP)

(73) Assignee: Yamaha Corporation, Hamamatsu (JP)

( * ) Notice: Subject to any disclaimer, the term of this patent is extended or adjusted under 35 U.S.C. 154(b) by 0 days.

(21) Appl. No.: 16/932,034

(22) Filed: Jul. 17, 2020

(65) Prior Publication Data

US 2020/0351587 A1 Nov. 5, 2020

Related U.S. Application Data

(63) Continuation of application No. PCT/JP2019/001358, filed on Jan. 17, 2019.

(30) Foreign Application Priority Data

Jan. 19, 2018 (JP) .............................. JP2018-007173

(51) Int. Cl.
 *H04R 3/12* (2006.01)
 *G08B 3/10* (2006.01)
 (Continued)

(52) U.S. Cl.
 CPC ................. *H04R 3/12* (2013.01); *G08B 3/10* (2013.01); *H03F 3/183* (2013.01); *H04R 1/403* (2013.01);
 (Continued)

(58) Field of Classification Search
 CPC .... H04R 29/00; H04R 29/001; H04R 29/002; H04R 3/12; H04R 1/403; H04R 3/04; H04R 27/00; H03F 2200/03
 (Continued)

(56) References Cited

U.S. PATENT DOCUMENTS 7,343,018 B2 * 3/2008 van der Werff ........ H04R 1/403
 381/80
7,974,424 B2 * 7/2011 Kushida ................... H04R 3/12
 381/303
 (Continued)

FOREIGN PATENT DOCUMENTS

JP 60-11590 U 1/1985
JP 3473803 B2 12/2003
 (Continued)

OTHER PUBLICATIONS

Chinese-language Office Action issued in Chinese Application No. 201980005806.0 dated Dec. 14, 2020 with English translation (15 pages).

(Continued)

*Primary Examiner* — Disler Paul

(74) *Attorney, Agent, or Firm* — Crowell & Moring LLP

(57) ABSTRACT

A speaker controller includes a switch that is inserted on a speaker wiring for supplying a sound signal to a speaker. A switch control circuit can extract and hold an ON/OFF control signal for instructing ON/OFF of the switch from an alternating-current signal supplied via the speaker wiring. A switch control circuit controls ON/OFF of the switch based on the ON/OFF control signal. A power supply circuit can generate a power supply voltage for operating the switch control circuit from the alternating-current signal supplied via the speaker wiring.

8 Claims, 4 Drawing Sheets

(51) Int. Cl.
*H03F 3/183* (2006.01)
*H04R 1/40* (2006.01)
*H04R 3/04* (2006.01)
*H04R 27/00* (2006.01)

(52) U.S. Cl.
CPC ............... *H04R 3/04* (2013.01); *H04R 27/00* (2013.01); *H03F 2200/03* (2013.01)

(58) Field of Classification Search
USPC ........................................ 381/77–78, 80–82
See application file for complete search history.

(56) References Cited

U.S. PATENT DOCUMENTS

| | | | | |
|---|---|---|---|---|
| 9,820,047 | B2* | 11/2017 | Kawamura | ............... H04R 3/04 |
| 10,015,610 | B2* | 7/2018 | Park | ........................ H04R 3/007 |
| 10,667,053 | B2* | 5/2020 | Nakagawa | ............... H04R 5/02 |
| 2005/0018857 | A1 | 1/2005 | McCarty et al. | |
| 2006/0182288 | A1* | 8/2006 | Arcaria | ................. H04R 29/007 381/82 |
| 2006/0251265 | A1* | 11/2006 | Asada | .................. H04R 29/001 381/58 |
| 2014/0301577 | A1* | 10/2014 | Togawa | ................... H03F 3/68 381/120 |
| 2015/0155839 | A1* | 6/2015 | Buono | ..................... H04R 3/04 381/94.1 |

FOREIGN PATENT DOCUMENTS

| | | |
|---|---|---|
| JP | 2005-45748 A | 2/2005 |
| JP | 2012-175151 A | 9/2012 |
| KR | 10-1605661 B1 | 3/2016 |
| WO | WO 2006/050754 A2 | 5/2006 |
| WO | WO 2017/078262 A1 | 5/2017 |

OTHER PUBLICATIONS

International Search Report (PCT/ISA/210) issued in PCT Application No. PCT/JP2019/001358 dated Apr. 9, 2019 with English translation (five pages).
Japanese-language Written Opinion (PCT/ISA/237) issued in PCT Application No. PCT/JP2019/001358 dated Apr. 9, 2019 (four pages).
Chinese-language Office Action issued in Chinese Application No. 201980005806.0 dated Jul. 8, 2021 with English translation (19 pages).
European Extended Search Report issued in European Application No. 19741544.1 dated Sep. 23, 2021 (seven (7) pages).
Japanese-language Office Action issued in Japanese Application No. 2018-007173 dated Jan. 18, 2022 with English translation (10 pages).
Chinese-language Office Action issued in Chinese Application No. 201980005806.0 dated Jan. 6, 2022 with English translation (19 pages).

* cited by examiner

SPEAKER CONTROLLER, SIGNAL SUPPLYING DEVICE, AND SPEAKER SYSTEM

CROSS REFERENCE TO RELATED APPLICATIONS

This application is a continuation of PCT application No. PCT/JP2019/001358, which was filed on Jan. 17, 2019 based on Japanese Patent Application (No. 2018-007173) filed on Jan. 19, 2018, the contents of which are incorporated herein by reference.

BACKGROUND OF THE INVENTION

1. Field of the Invention

The present subject matter relates to a speaker controller, a signal supplying device, and a speaker system that enable sound emission by an optional speaker among a plurality of speakers connected in parallel to a speaker wiring.

2. Description of the Related Art

In various facilities such as a supermarket and a hospital, a plurality of speakers may be arranged in a distributed manner at various places. For example, in an emergency such as a fire breakout, it is necessary to simultaneously emit emergency announcements to the speakers at the various places. On the other hand, for example, it may be preferable to emit, from only a specific speaker, shopping information or the like related to a specific sales floor in a supermarket. Therefore, there is a need for a technique of selecting an optional speaker in a plurality of speakers to perform sound emission. As such a technique, it is conceivable to connect a plurality of speakers to separate power amplifiers and drive the speakers separately. However, since such a technique requires a large number of power amplifiers and increases the number of wirings between the power amplifiers and the speakers, the cost may increase. Depending on the facility, a system may already exist in which a plurality of speakers are connected in parallel to one system of speaker wiring. In such a case, in order to use the above technique, it is necessary to remove the existing speaker wiring and route a new speaker wiring for connecting each power amplifier with each speaker, and a great cost is incurred. In addition, in a case where the facility is aged, it may be difficult to remove the existing speaker wiring and route a new speaker wiring.

JP-B-3473803 relates to a speaker inspection device, and discloses a system. In the system, a plurality of speakers are connected in parallel to one system of speaker wiring, normally-closed switches are connected to the respective speakers in series, and a switching unit that controls opening and closing of each normally-closed switch is provided. In this system, a desired speaker can be selected by the switching unit to be connected to the speaker wiring, and the other speakers can be disconnected from the speaker wiring. Therefore, if the technique disclosed in JP-B-3473803 is used, it is possible to optionally select a speaker to perform sound emission. However, in a case of using the technique disclosed in JP-B-3473803, it is necessary to provide a power supply wiring for supplying a power supply voltage to each switching unit that opens and closes each of the normally-closed switches, and the laying operation is complicated and an extra cost is incurred.

The present disclosure has been made in view of the above circumstances, and an object thereof is to provide a technique capable of causing an optional speaker among a plurality of speakers connected in parallel to a speaker wiring to perform sound emission without performing extra work such as laying a power supply wiring.

One aspect of the present disclosure provides a speaker controller including: a switch configured to selectively connect a sound signal to a speaker via a speaker wiring, a switch control circuit configured to extract and hold an ON/OFF control signal from an alternating-current control signal supplied via the speaker wiring to instruct ON/OFF of the switch based on the ON/OFF control signal, and a power supply circuit configured to generate a power supply voltage to operate the switch control circuit from the alternating-current signal supplied via the speaker wiring.

Further, another aspect of the present disclosure also provides a signal supplying device including: a control signal generator configured to generate an ON/OFF control signal for instructing ON/OFFs of a plurality of switches that respectively connect a plurality of speakers to a speaker wiring; and a signal outputting circuit configured to sequentially output a control signal and a sound signal to the speaker wiring, the control signal having the ON/OFF control signal.

The present disclosure provides a speaker system that includes the signal supplying device and a plurality of the speaker controllers. According to one aspect of the present disclosure, the control signal and the sound signal which are output by the signal supplying device are supplied to the speaker controller via the speaker wiring. In the speaker controller, the power supply circuit generates the power supply voltage from the alternating-current signal supplied via the speaker wiring, and supplies the power supply voltage to the switch control circuit. The switch control circuit extracts and holds the ON/OFF control signal from the alternating-current signal supplied via the speaker wiring to instruct ON/OFF of the switch inserted in the middle of the speaker wiring that supplies the sound signal to the speaker based on the ON/OFF control signal. Therefore, according to another aspect of the present disclosure, it is possible to cause an optional speaker among the plurality of speakers connected in parallel to the speaker wiring to perform sound emission without supplying the power supply voltage from the outside to the speaker controller.

DETAILED DESCRIPTION OF THE EXEMPLARY EMBODIMENTS

Hereinafter, embodiments of the present subject matter will be described below with reference to the drawings.

Figure 1:
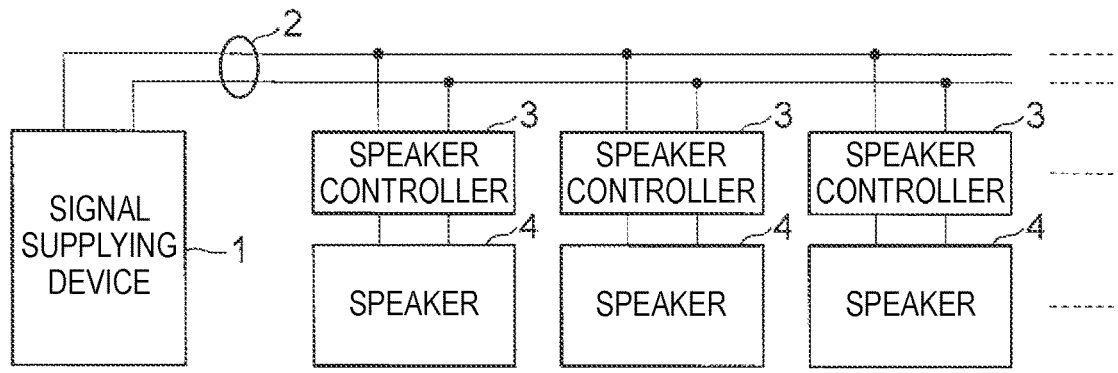
FIG. 1 is a block diagram illustrating a configuration of a speaker system in which a speaker controller is used according to an embodiment of the present subject matter.

FIG. 1 is a block diagram illustrating a configuration of a speaker system in which a speaker controller is used according to an embodiment of the present subject matter. The speaker system is installed in various facilities such as a supermarket, a hospital, a school, a library, a guidance device, an amusement park, and a haunted house. In particular, a plurality of speakers are arranged in a distributed manner at various places in the facility, and in a case where various sound signals are to be supplied to the speakers, it is possible to select a speaker to perform sound emission.

In the speaker system illustrated in FIG. 1, the signal supplying device 1 is connected to one system of speaker wiring 2 configured by two signal wires. A plurality of speakers 4 are connected in parallel to the speaker wiring 2 via the speaker controller 3. The signal supplying device 1 outputs, to the speaker wiring 2, a sound signal to be emitted by a desired speaker 4 among the plurality of speakers. In addition, the signal supplying device 1 outputs a control signal prior to the output of the sound signal. The control signal contains an ON/OFF control signal for instructing each speaker controller 3 whether each speaker 4 is connected to the speaker wiring 2. Each speaker controller 3 inserted between each speaker 4 and the speaker wiring 2 performs, based on the control signal output to the speaker wiring 2, switching control of whether the speaker 4 connected to each speaker controller 3 is connected to the speaker wiring 2. The speaker 4 may be a dynamic speaker. However, in the present embodiment, since the plurality of speakers 4 are connected in parallel to the speaker wiring 2, a capacitor speaker having a high input impedance is exemplified as the speaker 4.

Figure 2:
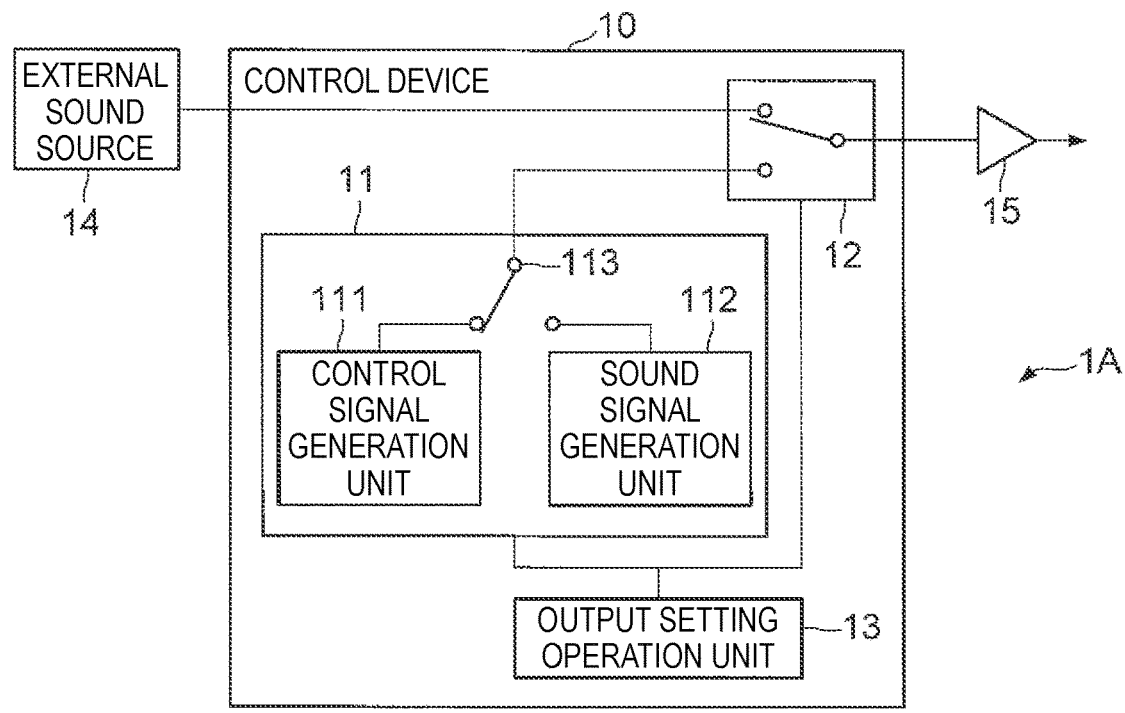
FIG. 2 is a block diagram illustrating a configuration example of a signal supplying device in the speaker system.

FIG. 2 is a block diagram illustrating a configuration of a signal supplying device 1A as an example of the signal supplying device 1 illustrated in FIG. 1. The signal supplying device 1A includes a control device 10, an external sound source 14, and a power amplifier 15. The control device 10 includes a signal generation unit 11, a switching unit 12, and an output setting operation unit 13. The output setting operation unit 13 selects one of an output signal of the external sound source 14 and an output signal of the signal generation unit 11 by the switching unit 12, in accordance with an operation of an operation element (not illustrated), and outputs the selected output signal. The power amplifier 15 amplifies an output signal of the control device 10 and outputs the amplified signal to the speaker wiring 2.

The signal generation unit 11 includes a control signal generation unit (control signal generator) 111, a sound signal generation unit 112, and a switching unit 113 (an example of outputting circuit). The sound signal generation unit 112 generates a sound signal to be emitted by an optional speaker 4 among the speakers 4 connected in parallel to the speaker wiring 2. The control signal generation unit 111 generates a control signal for causing only the speaker 4 (target speaker 4) to emit the sound signal. The switching unit 113 sequentially selects the control signal generated by the control signal generation unit 111 and the sound signal generated by the sound signal generation unit 112 and outputs the selected signal from the signal generation unit 11 to the switching unit 12.

For example, the following using method is considered for the signal supplying device 1A. The external sound source 14 generates, for example, a sound signal of background music (BGM). The sound signal generation unit 112 generates, for example, an announcement sound signal to be emitted by an optional speaker 4. In a case of not causing any of the speakers 4 to emit an announcement, the output setting operation unit 13 causes the switching unit 12 to select a sound signal generated by the external sound source 14 and outputs the sound signal to the power amplifier 15. In a case of causing a certain speaker 4 to emit an announcement, the output setting operation unit 13 causes the switching unit 12 to select an output signal of the signal generation unit 11, causes the control signal generation unit 111 to generate a control signal for causing the speaker 4 to perform sound emission, and causes the sound signal generation unit 112 to generate an announcement sound signal to be emitted by the speaker 4. Further, the switching units 113 and 12 (another example of outputting circuit) sequentially select the control signal generated by the control signal generation unit 111 and the sound signal generated by the sound signal generation unit 112 and output the selected signal to the power amplifier 15.

Figure 3:
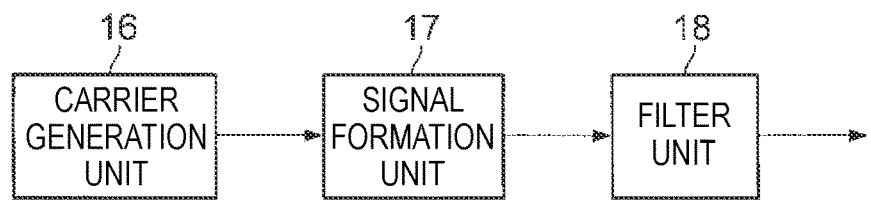
FIG. 3 is a block diagram illustrating a configuration example of a control signal generation unit of the signal supplying device.

FIG. 3 is a block diagram illustrating a configuration example of the control signal generation unit 111. As illustrated in FIG. 3, the control signal generation unit 111 includes a carrier generation unit 16, a signal formation unit (signal forming circuit) 17, and a filter unit (filter) 18. The carrier generation unit 16 is a circuit that generates a carrier that is a sine wave of 16 kHz. The signal formation unit 17 is a circuit that performs ON/OFF modulation on the carrier output by the carrier generation unit 16 to generate a control signal. The filter unit 18 is a circuit that selectively filters only a signal in a band of a predetermined bandwidth centering on 16 kHz, from the control signal output by the signal formation unit 17, and that outputs the selected signal.

Figure 4:
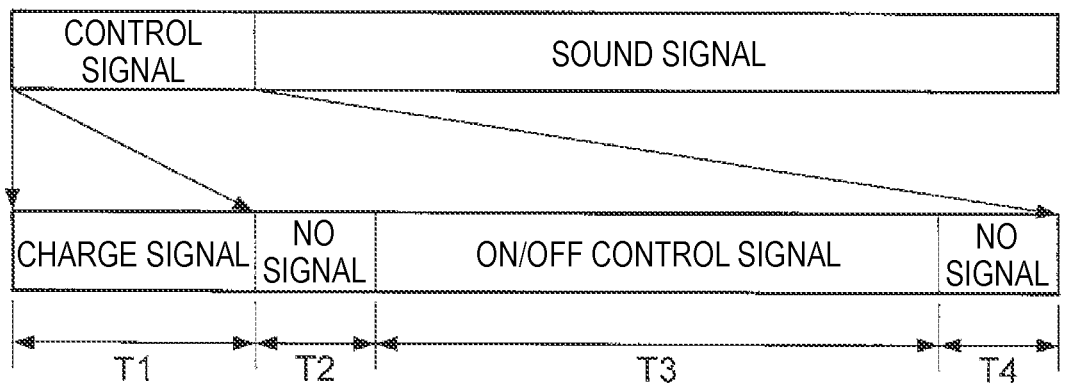
FIG. 4 is a time chart illustrating a configuration of a control signal that the signal supplying device outputs to a speaker wiring, and a configuration of a sound signal.

FIG. 4 is a time chart illustrating contents of an alternating-current signal output from the signal supplying device 1 to the speaker wiring 2. As illustrated in FIG. 4, the signal supplying device 1 outputs a control signal prior to output of a sound signal. The control signal includes a charge signal having a time length T1, a no-signal section having a time length T2, an ON/OFF control signal having a time length T3, and a no-signal section having a time length T4. In this example, the time length T1 is 1 sec, the time lengths T2 and T4 are 10 msec, and the time length T3 is a variable time length corresponding to the number of transmission bits n, and is 4 msec. The number of transmission bits n is a number obtained by adding the number of bits of a key number to be described below to the number of speakers 4 connected in parallel to the speaker wiring 2.

The charge signal is a signal obtained by continuously passing the carrier over the time length T1 by the signal formation unit 17 in FIG. 3, that is, a sine wave burst signal of 16 kHz. The charge signal is used by the speaker controller 3 to generate a power supply voltage.

A non-signal section of the time length T2 after the charge signal is a section used for timing control for the speaker controller 3 to start receiving the ON/OFF control signal.

The ON/OFF control signal represents bits corresponding to the speakers 4 connected in parallel to the speaker wiring 2 and serial bits configured by bits constituting the key number. In the present embodiment, a 1-bit ON/OFF control signal is represented by a waveform within a time period of 4 msec. Specifically, a bit "0" is represented by a combination of a burst signal of 1 msec and a no-signal section of 3 msec, and a bit "1" is represented by a combination of a burst signal of 3 msec and a no-signal section of 1 msec.

The no-signal section of the time length T4 after the ON/OFF control signal is a period for causing the speaker controller 3 to hold the ON/OFF control signal and to perform switching control of whether the speaker 4 is connected to the speaker wiring 2.

Figure 5:
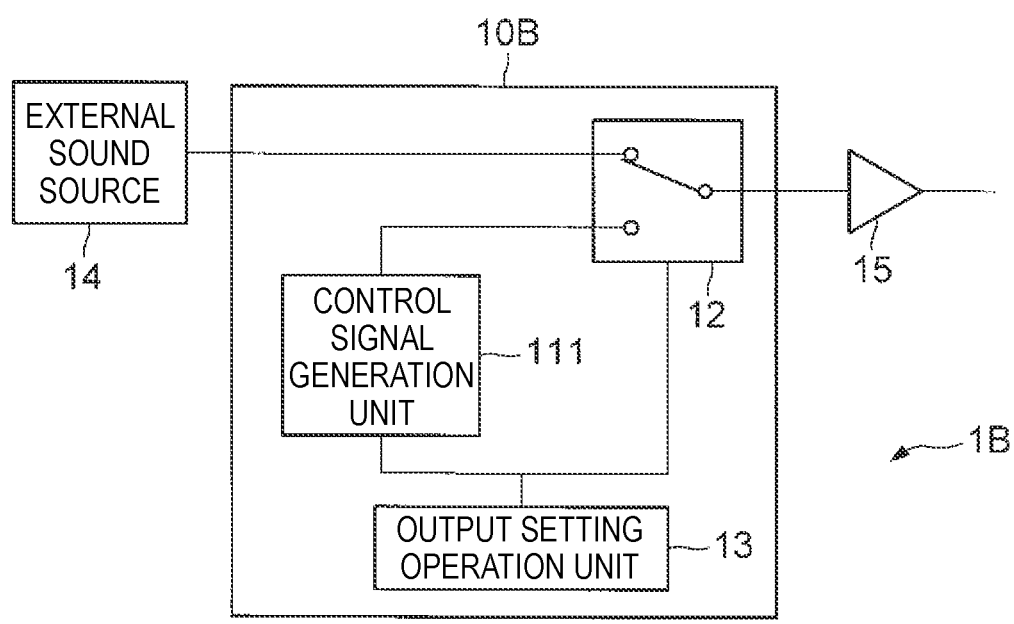
FIG. 5 is a block diagram illustrating another configuration example of the signal supplying device in the speaker system.

FIG. 5 is a block diagram illustrating a configuration of a signal supplying device 1B as another example of the signal supplying device 1. The signal supplying device 1B has a configuration in which the sound signal generation unit 112 and the switching unit 113 are removed from the signal supplying device 1A. In the signal supplying device 1B, the external sound source 14 generates a sound signal to be emitted by an optional speaker 4 among a plurality of speakers 4 connected in parallel to the speaker wiring 2. The control signal generation unit 111 generates a control signal for causing only the speaker 4 to emit the sound signal. The switching unit 12 sequentially selects the control signal generated by the control signal generation unit 111 and the sound signal generated by the external sound source 14 and outputs the selected signal to the power amplifier 15.

Figure 6:
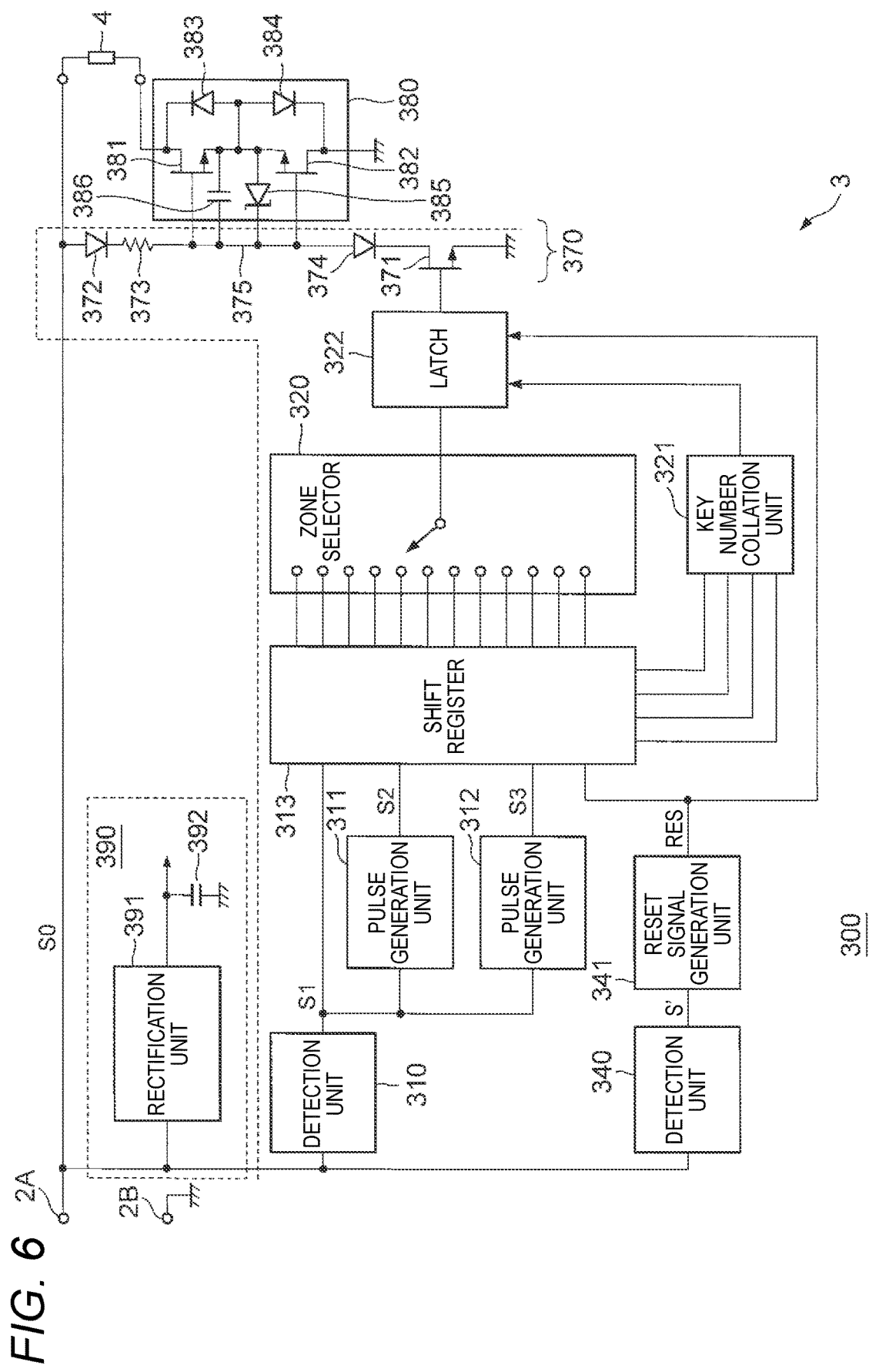
FIG. 6 is a circuit diagram illustrating a configuration example of the speaker controller.

FIG. 6 is a circuit diagram illustrating a configuration of the speaker controller 3 according to the present embodiment. The speaker controller 3 includes a normally-on type switch 380 inserted in the middle of a speaker wiring for supplying a sound signal to the speaker 4, a switch control circuit 300 that performs ON/OFF control of the switch 380, and a power supply circuit 390. In the example illustrated in FIG. 6, the speaker controller 3 is configured to receive an ON/OFF control signal of 16 bits.

FIG. 6 illustrates terminals 2A and 2B that are connected to the speaker wiring 2 of FIG. 1. Here, the speaker wiring 2 is a wiring that serves as a path of a sound signal for driving the speaker 4, and includes the speaker wiring in a section from the terminal 2A, via the speaker 4 and the switch 380, back to the signal supplying device 1 from the terminal 2B, in addition to the speaker wiring in a section from the signal supplying device 1 to the terminal 2A.

The power supply circuit 390 is a circuit that generates a power supply voltage to operate the switch control circuit 300, from an alternating-current signal supplied via the speaker wiring 2. More specifically, the power supply circuit 390 includes a rectification unit 391 that rectifies an alternating-current signal supplied via the speaker wiring 2, and a capacitor 392 charged by a direct-current voltage obtained from the rectification unit 391. A charging voltage of the capacitor 392 serves as a power supply voltage for the switch control circuit 300.

In the switch control circuit 300, a detection unit 310 detects an alternating-current signal S0 supplied via the speaker wiring 2, and outputs an envelope signal S1 having an envelope waveform of the alternating-current signal S0.

A pulse generation unit 311 is configured with, for example, a monostable multivibrator, and supplies a clock pulse S2 having a predetermined pulse width to a shift register 313, by using a rising edge of the envelope signal S1 output from the detection unit 310 as a trigger. In the present embodiment, a pulse width of the clock pulse is 2 msec. The shift register 313 samples and captures an output signal of the detection unit 310 according to a falling edge of a pulse output from the pulse generation unit 311, and performs a shift operation. The pulse generation unit 311 and the shift register 313 constitute a demodulation unit (demodulation circuit) that extracts and stores a plurality of bits from an alternating-current signal supplied via the speaker wiring 2.

The pulse generation unit 312 is a circuit that generates an instruction for causing the shift register 313 to perform a parallel output operation, at a timing when all bits of an ON/OFF control signal are captured by the shift register 313.

The pulse generation unit 312 is configured with, for example, a retriggerable monostable multivibrator. The retriggerable monostable multivibrator is configured to start outputting a pulse using a timing of a retrigger as a start point in a case where the trigger (retrigger) is provided again before output of a pulse having a set pulse width is finished. The pulse generation unit 312 generates, with the retriggerable monostable multivibrator, a pulse S3 which rises up in response to a start of supply of an ON/OFF control signal and falls down at a timing when all bits of the ON/OFF control signal are stored in the shift register 313. In the present embodiment, the parallel output operation of the shift register 313 and a latch operation of a latch 322 are activated according to a falling edge of the pulse S3.

In the example illustrated in FIG. 6, the shift register 313 performs parallel output of 16 bits, and supplies 12 bits of the parallel output to a zone selector 320 and the remaining 4 bits as a key number to a key number collation unit (collating circuit) 321.

The zone selector 320 selects 1 bit of the 12 bits supplied from the shift register 313, in accordance with an operation of an operation element provided in the speaker controller 3, and supplies the selected 1 bit to the latch 322. The zone selector 320 functions as an instructing unit (instructing circuit) that instructs a bit, among a plurality of bits stored in the demodulation unit (in this case, the shift register 313), to be held in the latch 322 that is a holding unit (holding circuit).

The key number collation unit 321 is a collation unit that collates a key number output from the shift register 313 with a key number set in advance in the speaker controller 3, to see whether the two match with each other, and provides a permission signal to the latch 322 only where the two match with each other. The latch 322 holds and outputs an ON/OFF control signal of 1 bit selected by the zone selector 320 only when the permission signal from the key number collation unit 321 is provided. In this way, the latch 322 functions as a holding unit that holds, as an ON/OFF control signal, a particular bit among a plurality of bits stored in the demodulation unit when a predetermined time elapses after bit extraction by the demodulation unit (pulse generation unit 311 and shift register 313) completes. ON/OFF of the switch 380 connected in series to the speaker 4 is determined according to the output signal of the latch 322. Specifically, the switch 380 is turned ON when the output signal of the latch 322 is at an L level, and is turned OFF when the output signal of the latch 322 is at an H level.

The reason why the key number collation unit 321 is provided is that although the probability is low, a sound signal subsequent to a control signal may be stored in the shift register 313 as a 16-bit digital signal. In order to prevent data in the shift register 313 from being erroneously stored in the latch 322 when such a situation occurs, in the present embodiment, 4 bits of the 16-bit ON/OFF control signal are used as a key number, and a holding operation of the latch 322 is permitted only when a key number stored in the shift register 313 is a preset key number.

Similar to the detection unit 310, a detection unit 340 performs detection of the alternating-current signal S0 supplied via the speaker wiring 2, and outputs an envelope signal S1' having an envelope waveform of the alternating-current signal S0. The envelope signal S1' has the same waveform as the envelope signal S1.

A reset signal generation unit 341 is an initialization unit (initializing circuit) that, in a case where the envelope signal S1' output from the detection unit 340 maintains an L level over 5 sec or more, determines that 5 seconds or more elapses since a sound signal is paused, transmits a reset signal RES to the shift register 313 and the latch 322 for initialization, to turn the switch 380 ON.

The reason why such a reset signal generation unit 341 is provided is as follows. In the present embodiment, an emergency broadcast or the like is assumed, and the switches 380 of all the speaker controllers 3 are normally in an ON state. However, when data for turning off the switch 380 is once held in the latch 322 in a certain speaker controller 3, charge of the capacitor 392 is discharged, and the latch 322 is not reset and the switch 380 is maintained in an OFF state unless the power supply voltage is completely 0V in the speaker controller 3. Therefore, in the present embodiment, in all the speaker controllers 3, the shift register 313 and the latch 322 are initialized to turn the switch 380 ON when 5 seconds or more elapses since supply of the sound signal is paused.

A gate driver 370 is a circuit that drives the switch 380 based on an output signal of the latch 322. The gate driver 370 includes a diode 372 having an anode connected to the terminal 2A, a resistor 373 having one end connected to a cathode of the diode 372, a diode 374 having an anode connected to the other end of the resistor 373, and an N-channel field effect transistor (FET) in which a drain is connected to a cathode of the diode 374, a source is grounded, and a gate is provided with an output signal of the latch 322. In the gate driver 370, a node 375 between the resistor 373 and the diode 374 is a node that performs ON/OFF control of the switch 380. When an output signal of the latch 322 is at an H level, the N-channel FET 371 is turned ON, and the node 375 is at an L level. On the other hand, when the output signal of the latch 322 is at an L level, the N-channel FET 371 is turned OFF, and potential of the node 375 depends on a voltage of the terminal 2A.

The switch 380 includes N-channel FETs 381 and 382 whose sources are connected in common. The gates of these N-channel FETs 381 and 382 are connected to the node 375 between the resistor 373 and the diode 374 of the gate driver 370. A drain of the N-channel FET 381 is connected to the terminal 2A via the speaker 4, and a drain of the N-channel FET 382 is grounded. A diode 383 is a parasitic diode between a p-type substrate on which the N-channel FET 381 is formed and the drain of the N-channel FET 381, and a cathode thereof is connected to the drain of the N-channel FET 381, and an anode thereof (that is, p-type substrate) is connected to the source of the N-channel FET 381. A diode 384 is a parasitic diode between a p-type substrate on which the N-channel FET 382 is formed and the drain of the N-channel FET 382, and a cathode thereof is connected to the drain of the N-channel FET 382 and an anode thereof (that is, p-type substrate) is connected to the source of the N-channel FET 382. A capacitor 386 is connected between the node 375 and a connection node of the sources of the N-channel FETs 381 and 382. Further, a cathode of a Zener diode 385 is connected to the node 375, and an anode of the Zener diode 385 is connected to the connection node of the sources of the N-channel FETs 381 and 382.

In such a configuration, when the output signal of the latch 322 is at the H level, since the node 375 is at the L level, gate-source voltages of the N-channel FETs 381 and 382 are approximately 0 V, and both of the N-channel FETs 381 and 382 are turned OFF. Therefore, regardless of polarity of a voltage applied to the terminal 2A, the switch 380 is turned OFF.

When the output signal of the latch 322 is at the L level, the N-channel FET 371 is turned OFF. In this state, when a positive voltage is applied to the terminal 2A, the positive voltage is applied to the gate of the N-channel FET 381 via the diode 372 and the resistor 373, and the N-channel FET 381 is turned ON. As a result, a current flows from the terminal 2A, through the speaker 4, the N-channel FET 381 and the diode 384, to the ground. During this period, the capacitor 386 is charged with a voltage at which an electrode on the node 375 side is positive and an electrode on the connection node side of the sources of the N-channel FETs 381 and 382 is negative.

Next, when a negative voltage is applied to the terminal 2A, the N-channel FET 381 is turned OFF, and a charging voltage of the capacitor 386 charged during the period in which the N-channel FET 381 is ON is applied between the gate and the source of the N-channel FET 382. As a result, the N-channel FET 382 is turned ON, and a current flows from the ground, through the N-channel FET 382 and the diode 383, and the speaker 4, to the terminal 2A.

In this way, when the output signal of the latch 322 is at the L level, the N-channel FETs 381 and 382 are alternately turned ON in accordance with the polarity of the voltage applied to the terminal 2A, and bidirectional energization to the speaker 4 is performed.

Figure 7:
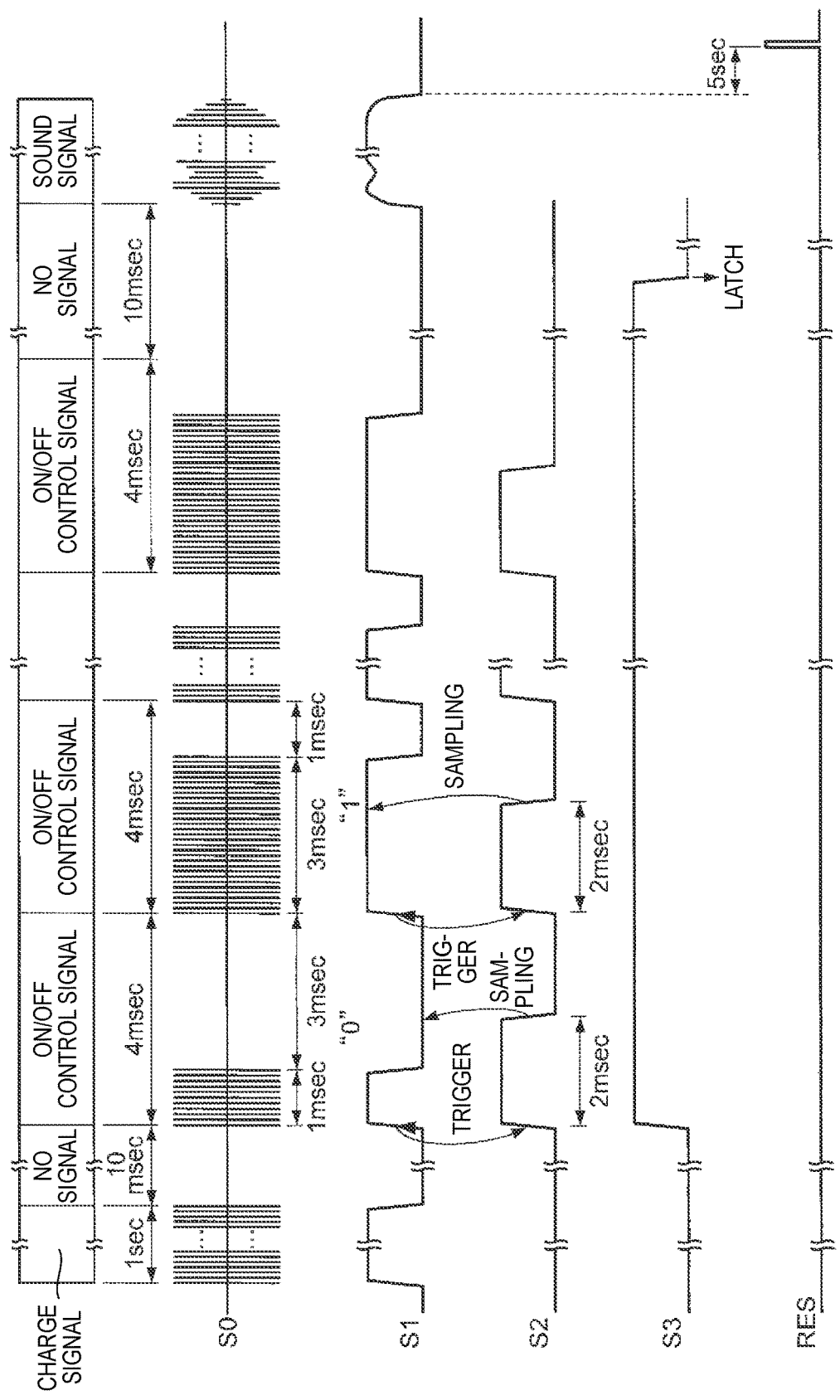
FIG. 7 is a time chart illustrating a waveform of each unit of the speaker controller.

FIG. 7 is a time chart illustrating a waveform of each unit of the speaker controller 3 according to the present embodiment. Hereinafter, an operation of the present embodiment will be described with reference to FIG. 7.

FIG. 7 illustrates the alternating-current signal S0 supplied to the speaker controller 3 via the speaker wiring 2. The alternating-current signal S0 contains a control signal and a sound signal output by the signal supplying device 1. More specifically, in a case of causing the speaker 4 of any one of the plurality of speakers 4 to perform sound emission, the signal supplying device 1 outputs a control signal for causing the speaker 4 (target speaker 4) to perform sound emission to the speaker wiring 2, and subsequently outputs a sound signal that is an emission target to the speaker wiring 2. In this case, among the ON/OFF control signals constituting the control signal, the signal supplying device 1 sets "0" to one corresponding to the speaker 4 that is caused to perform sound emission, and "1" to one corresponding to the speaker 4 that is not caused to perform sound emission.

The control signal supplied to the speaker controller 3 starts from a charge signal that is a burst signal having a time length of 1 sec. In the speaker controller 3, the charge signal is rectified by the rectification unit 391, and the capacitor 392 is charged by a direct-current voltage obtained by the rectification unit 391. Accordingly, a charging voltage of the capacitor 392, which is a power supply voltage of the speaker controller 3, rises up.

In the switch control circuit 300, the detection unit 310 detects the alternating-current signal S0 supplied via the speaker wiring 2, and outputs the envelope signal S1.

As described above, in the ON/OFF control signal, a burst signal having a time length of 1 msec or a time length of 3 msec is generated at a cycle of 4 msec. Here, a signal configured by a burst signal of 1 msec and a no-signal section of 3 msec represents a bit "0", and a signal configured by a burst signal of 3 msec and a no-signal section of 1 msec represents a bit "1". Accordingly, while the ON/OFF control signal is supplied via the speaker wiring 2, the envelope signal S1 output by the detection unit 310 rises up at a cycle of 4 msec and maintains the H level for a time length of 1 msec or 3 msec.

In the present embodiment, a pulse width of the monostable multivibrator of the pulse generation unit 311 is set to 2 msec. Therefore, the pulse generation unit 311 outputs the clock pulse S2 having a pulse width of 2 msec, by using a rising edge appearing at intervals of 4 msec in the envelope signal S1 as a trigger. The shift register 313 samples and captures the envelope signal S1 according to a falling edge of the clock pulse S2, and performs a shift operation.

In FIG. 7, a first ON/OFF control signal represents the bit "0". In a period during which the bit "0" is supplied to the speaker controller 3, since the clock pulse S2 falls down within a period in which the envelope signal S1 is at the L level, the L level, that is, the bit "0" is captured by the shift register 313.

In FIG. 7, a second ON/OFF control signal represents the bit "1". In a period during which the bit "1" is supplied to the speaker controller 3, since the clock pulse S 2 falls down within a period in which the envelope signal S 1 is at the H level, the H level, that is, the bit "1" is captured by the shift register 313.

In the present embodiment, a pulse width of the retriggerable monostable multivibrator in the pulse generation unit 312 is set to 10 msec. While the ON/OFF control signal is supplied via the speaker wiring 2, the envelope signal S1 output by the detection unit 310 rises up at a cycle of 4 msec. Therefore, the retriggerable monostable multivibrator of the pulse generation unit 312 is retriggered every 4 msec while the ON/OFF control signal is continuing, and the output pulse S3 maintains at the H level. Further, when a trigger corresponding to a last bit (the 16th bit in this example) of the ON/OFF control signal is provided to the pulse generation unit 312, no trigger is provided to the pulse generation unit 312 thereafter. Therefore, the output pulse S3 of the pulse generation unit 312 falls down at a timing when 10 msec elapses since the trigger corresponding to the last bit of the ON/OFF control signal is provided to the pulse generation unit 312.

The shift register 313 performs parallel output of a serial bit in the shift register 313 according to a falling edge of the output pulse S3 of the pulse generation unit 312, and the latch 322 holds a bit selected by the zone selector 320 from among bits output in parallel.

At this time, the key number collation unit 321 collates a key number, which is constituted by a part of bits among the bits output in parallel, with a preset key number, and permits a holding operation of the latch 322 only when the two match with each other.

The gate driver 370 turns ON the switch 380 when the bit stored in the latch 322 is "0" and turns OFF when the bit is "1".

When supply of the ON/OFF control signal to the speaker controller 3 is completed, a no-signal section of 10 msec occurs. The parallel output operation of the shift register 313 and the holding operation of the latch 322 are performed in this no-signal section. Further, when the no-signal section ends, supply of the sound signal to the speaker controller 3 is started.

At this time, if the switch 380 is ON, the speaker 4 performs sound emission based on the sound signal, and if the switch 380 is OFF, the speaker 4 does not perform sound emission.

When the supply of the sound signal is paused, the envelope signal S1' (see the envelope signal S1 of FIG. 7) output by the detection unit 340 falls down. Further, when the envelope signal S1' maintains the L level over 5 seconds or more, the reset signal generation unit 341 determines that the supply of the sound signal is paused, transmits the reset signal RES to the shift register 313 and the latch 322 for initialization, and turns ON the switch 380.

As described above, according to the present embodiment, with the control signal output to the speaker wiring 2 prior to the sound signal, only the desired speaker 4 among the plurality of speakers 4 can be connected to the speaker wiring 2, and sound emission based on the sound signal can be performed. For example, in a case of emitting an announcement of "Today's salmon is cheaper" in a supermarket, it is possible to connect only the speaker 4 installed at a fish section to the speaker wiring 2, and emit the announcement only at a sales floor associated therewith. Further, since the switch 380 of each speaker controller 3 is returned to ON after completion of the supply of the sound signal, an announcement such as "fire breakout" can be emitted from all the speakers 4 in an emergency.

Further, according to the present embodiment, since the power supply circuit 390 of the speaker controller 3 generates the power supply voltage for actuating the switch control circuit 300 from the alternating-current signal supplied via the speaker wiring 2, it is not necessary to provide a power supply wiring or the like for supplying the power supply voltage to the speaker controller 3.

Further, according to the present embodiment, when a speaker system is introduced which causes only the desired speaker 4 to perform sound emission, it is sufficient to connect the speaker controller 3 to the speaker 4, and routing of a new speaker wiring or the like is not necessary. Therefore, it is possible to introduce a speaker system at low cost which causes only the desired speaker 4 to perform sound emission.

Other Embodiments

Although one embodiment of the present subject matter has been described above, other embodiments are conceivable for the present subject matter. For example, the embodiments are as follows.

(1) Although the speaker controller 3 may be provided as a device separate from the speaker 4, the speaker controller 3 may be incorporated in the speaker 4 and provided integrally with the speaker 4.

(2) In the embodiment described above, the signal supplying device 1 outputs the charge signal as the first signal of the control signal. However, when supply of a next sound signal is started in a short time after supply of a preceding sound signal is finished, a power supply voltage sufficient to operate the switch control circuit 300 remains in the capacitor 392 of the power supply circuit 390 of the speaker controller 3 in many cases. Therefore, when the elapsed time from the completion of the supply of the preceding sound signal is short, the time length of the charge signal may be shortened or the output of the charge signal may be omitted.

(3) In order to prevent the ON/OFF control signal from being erroneously extracted from the sound signal, which is supplied after the completion of the supply of the control signal, and stored in the shift register 313, a BPF or the like that selectively filters a signal in a band of a predetermined bandwidth including a frequency (16 kHz in the embodiment described above) of the carrier used to generate the control signal may be provided at a preceding stage of the detection units 310 and 340.

(4) Although the external sound source 14 and the power amplifier 15 are provided in the signal supplying device 1A illustrated in FIG. 2 and in the signal supplying device 1B illustrated in FIG. 5, the external sound source 14 and the power amplifier 15 are not essential elements and may not be provided in the signal supplying device.

(5) As an aspect of supplying the control signal and the sound signal to the speaker controller 3, there may be the following aspect in addition to an aspect in which a sound signal generated in real time is supplied together with a control signal. That is, the control signal for turning ON the switch 380 of a specific speaker controller 3 and the sound signal to be emitted from the speaker 4 connected to the speaker controller 3 are stored in a nonvolatile memory, and the signal supplying device 1 reads the control signal and the sound signal in accordance with a selection operation of a user and outputs the control signal and the sound signal to the speaker wiring 2. This aspect has an advantage that operability of the signal supplying device 1 is improved.

According to the present subject matter, it is useful because it is possible to cause an optional speaker among a plurality of speakers connected in parallel to a speaker wiring to perform sound emission without extra work such as laying the power supply wiring.

What is claimed is:

1. A speaker controller, comprising:
   a switch configured to selectively connect a speaker wiring to a speaker, the speaker wiring conveying an alternating-current signal comprising a sound signal and a control signal to be supplied to the speaker;
   a switch control circuit configured to extract and hold an ON/OFF control signal from the control signal of the alternating-current signal supplied via the speaker wiring to instruct ON/OFF state of the switch based on the ON/OFF control signal, wherein
   the control signal precedes the sound signal, and
   the control signal starts with a charge signal; and
   a power supply circuit configured to generate, from the charge signal, a power supply voltage to operate the switch control circuit from the alternating-current signal supplied via the speaker wiring.

2. The speaker controller according to claim 1, wherein the switch control circuit comprises:
   a demodulation circuit configured to extract and store a plurality of bits from the alternating-current signal supplied via the speaker wiring; and
   a holding circuit configured to hold, as the ON/OFF control signal, a bit of the plurality of bits stored in the demodulation circuit when a predetermined time elapses after the demodulation circuit completes the extraction of the plurality of bits.

3. The speaker controller according to claim 2, further comprising:
   an initializing circuit configured to initialize the demodulation circuit and the holding circuit when a predetermined time elapses after supply of the alternating-current signal via the speaker wiring is paused.

4. The speaker controller according to claim 1, wherein the switch is a normally-closed type and stays in an ON state while the switch is not operated or controlled.

5. The speaker controller according to claim 1, wherein the switch control circuit comprises an initializing circuit configured to turn the switch ON when a predetermined time elapses since supply of the sound signal is paused.

6. A signal supplying device, comprising:
   a control signal generator configured to generate an ON/OFF control signal for instructing ON/OFF states of a plurality of switches that respectively connect a plurality of speakers to a speaker wiring for conveying an alternating-current signal; and
   a signal output circuit configured to sequentially output the alternating-current signal, comprising a control signal and a sound signal to the speaker wiring, wherein
   the control signal comprises the ON/OFF control signal,
   the control signal precedes the sound signal, and
   the control signal starts with a charge signal.

7. The signal supplying device according to claim 6, wherein the control signal generator comprises:
   a signal forming circuit configured to modulate a carrier based on the ON/OFF control signal; and
   a filter configured to selectively filter a signal in a band of a predetermined bandwidth including a frequency of the carrier from an output signal of the signal forming circuit.

8. A speaker system, comprising:
   a plurality of speakers;
   a plurality of speaker controllers according to claim 1;
   a signal supplying device comprising:
      a control signal generator configured to generate ON/OFF control signals for instructing ON/OFF states of the plurality of switches that respectively connect the plurality of speakers to the speaker wiring; and
      a signal output circuit configured to sequentially output the alternating-current signal comprising the control signal and the sound signal to the speaker wiring, wherein
      the control signal comprises the ON/OFF control signals.

* * * * *